(12) United States Patent
Tabe et al.

(10) Patent No.: US 9,345,174 B2
(45) Date of Patent: May 17, 2016

(54) CONTAINER-TYPE DATA CENTER HAVING AIR CONDITIONING FACILITY

(71) Applicant: HITACHI SYSTEMS, LTD., Tokyo (JP)

(72) Inventors: Kenichi Tabe, Kanagawa (JP); Takeshi Kobayashi, Ibaraki (JP); Yutaka Asano, Tokyo (JP)

(73) Assignee: HITACHI SYSTEMS, LTD., Tokyo (JP)

( * ) Notice: Subject to any disclaimer, the term of this patent is extended or adjusted under 35 U.S.C. 154(b) by 0 days.

(21) Appl. No.: 14/782,028

(22) PCT Filed: Apr. 24, 2013

(86) PCT No.: PCT/JP2013/062045
§ 371 (c)(1),
(2) Date: Oct. 2, 2015

(87) PCT Pub. No.: WO2014/174607
PCT Pub. Date: Oct. 30, 2014

(65) Prior Publication Data
US 2016/0057892 A1    Feb. 25, 2016

(51) Int. Cl.
*H05K 7/20*    (2006.01)
*G06F 1/20*    (2006.01)

(52) U.S. Cl.
CPC .............. *H05K 7/20745* (2013.01); *G06F 1/20* (2013.01)

(58) Field of Classification Search
CPC ......... H05K 7/1497; H05K 5/02; H05K 7/18; G06F 1/20; F28F 13/00; F28F 27/00; F28F 15/00; F28F 17/04; F28F 3/122; F28F 31/00
USPC ............... 361/679.46–679.53, 690–696, 689, 361/698–702, 717, 800; 165/80.2–80.5, 165/104.14, 104.26, 121–126, 185; 454/184, 187, 228, 229, 230, 236, 237; 312/223.2, 198, 257.1, 265.1–265.5, 312/236, 201; 220/1.5, 628, 635, 661, 676, 220/421, 453, 455, 62.1, 62.22; 62/199, 62/259.2
See application file for complete search history.

(56) References Cited

U.S. PATENT DOCUMENTS 7,852,627 B2 * 12/2010 Schmitt ................ H05K 7/1497
                                                     361/694
8,310,829 B2 * 11/2012 Monk .................. F24F 11/0001
                                                     361/694

(Continued)

FOREIGN PATENT DOCUMENTS

CN    202058079 U    11/2011
JP    2012-252639 A    12/2002

(Continued)

OTHER PUBLICATIONS

International Search Report dated Jul. 23, 2013 for Application No. PCT/JP2013/062045.

(Continued)

*Primary Examiner* — Michail V Datskovskiy
(74) *Attorney, Agent, or Firm* — Ladas & Parry LLP

(57) ABSTRACT

The present invention provides a container-type data center having an air conditioning facility, which enables to effectively cool IT equipment by applying the arrangement to an existing container. A system ceiling 50 is attached to a ceiling surface 25 to send out cooling air to a cooling area 2 from a vent 31a of an indoor unit 31 of an air conditioning device disposed in a container 1, and a draft air duct is defined by the system ceiling 50, a down-wall 51 and the ceiling surface 25. A vinyl curtain 60 is provided on an upper portion of a rack 40 so as to prevent cooling air having reached the cooling area 2 from flowing out to a heat exhaust area 3 without passing through the rack 40 loading the IT equipment, and a vinyl curtain 70 in a form of a shop curtain is disposed at an area used as a path for operators entering the cooling area 2. According to this arrangement, all the cooling air sent to the cooling area 2 is discharged through racks 40 lading IT equipments to the heat exhaust area 3, enhancing the effect of cooling the IT equipment loaded in the racks 40.

3 Claims, 6 Drawing Sheets

(56) References Cited

U.S. PATENT DOCUMENTS

| | | | | |
|---|---|---|---|---|
| 8,456,841 | B2* | 6/2013 | Peng | H05K 7/1497 361/694 |
| 8,457,536 | B2* | 6/2013 | Nakamatsu | G03G 15/161 399/101 |
| 8,462,496 | B2* | 6/2013 | Schmitt | G06F 1/20 165/104.33 |
| 8,488,311 | B2* | 7/2013 | Tsai | H05K 7/1497 165/104.33 |
| 8,755,184 | B2* | 6/2014 | Peng | H05K 7/1497 361/679.46 |
| 2006/0082263 | A1* | 4/2006 | Rimler | B60P 3/14 312/201 |
| 2013/0008197 | A1* | 1/2013 | Lin | H05K 7/1497 62/186 |

FOREIGN PATENT DOCUMENTS

| | | | | |
|---|---|---|---|---|
| JP | 2010-71482 | A | 4/2010 | |
| JP | 2012-53747 | A | 3/2012 | |
| JP | 02012053747 | A * | 3/2012 | G06F 1/20 |
| JP | 2012-98799 | A | 5/2012 | |
| JP | 2012098799 | A * | 5/2012 | G06F 1/00 |
| JP | 2013134032 | A * | 7/2013 | F24F 7/08 |

OTHER PUBLICATIONS

Notification of Reasons for Refusal dated Dec. 16, 2014 for Application No. JP 2014-543379.
J-PlatPat English abstract of JP 2012-98799 A.
J-PlatPat English abstract of JP 2012-252639 A.
J-PlatPat English abstract of JP 2012-53747 A.
J-PlatPat English abstract of JP 2010-71482 A.
espacenet English abstract of CN 202058079 U.
Machine translation of abstract of CN 202058079 U.
https://www.hitachi-systems.com/solution/s006/fmitsm/cdc.html with partial English translation.

* cited by examiner

CONTAINER-TYPE DATA CENTER HAVING AIR CONDITIONING FACILITY

RELATED APPLICATION

This application is an application under 35 U.S.C. 371 of International Application No. PCT/JP2013/062045 filed on Apr. 24, 2013, the entire contents of which are incorporated herein by reference.

TECHNICAL FIELD

The present invention relates to a container-type data center having an air conditioning facility, and specifically, relates to a container-type data center having air conditioning facility capable of being applied to an existing container to facilitate enhancement of cooling efficiency of IT equipment and the like.

BACKGROUND ART

A container-type data center has necessary facilities for constituting a data center stored in a container-type box used as a cargo transportation means using a trailer or the like, as taught in Non-Patent Literature 1. Actually, a container-type data center can store servers, storage apparatuses, control devices, air-conditioning facilities and power supply facilities, so that the container itself can be operated as a data center. It is possible to recognize the container-type data center as a new form of data center capable of being installed outdoors or being transported.

It has been recognized in Japan that the use of such container-type data centers are difficult due to the restrictions by the Building Standards Act, but on Mar. 25, 2011, a notice has been issued from the Ministry of Land, Infrastructure, Transport and Tourism on "Handling of the Building Standards Act regarding Container-type Data Center". According to the notice, "Regarding container-type data centers that can be disposed independently on land, those having only a main body of a server device and facilities required for realizing the functions of the data server installed therein, having minimum internal space required for realizing the functions of the data server such as the airway for air conditioning, and which are unattended during operation so that a person only enters the container when a serious failure occurs to the devices installed therein are classified as a storehouse or other similar facilities defined in Article 2 item 3 of the Law. However, when multiple data centers are stacked, they are handled as a facility corresponding to a building architecture, instead of a storehouse or other similar facilities."

As for containers, the size of the external shape of the container is prescribed based on ISO Standards, and in many cases, 40-feet-type containers are assigned as the container-type data centers. In the prior-art container-type data center, outdoor units of the air conditioning facility were disposed outside the container, so that it was necessary to arrange the container-type data center at a determined location, install outdoor units for air conditioning near the container, and then connect the air conditioning piping with indoor units of the data center.

Patent Literature 1 (Japanese Patent Application Laid-Open Publication No. 2012-98799) is aimed at providing a unit type data center in an efficient form and a server room unit effectively and properly used as a structural element of the unit type data center. A server room unit includes multiple server racks and a cooling facility in a casing that can be installed adjacently to another casing, and functions by itself as a server room. In the casing, a cold area and a hot area are formed as sections, and the server racks are aligned at a boundary between the cold area and the hot area so that air can pass through the server racks. The cooling facility includes exhaust fans for supplying outside air to the cold area and discharging the air from the hot area to the outside, and air conditioners for conditioning cool air and circulating the cool air in the casing.

Patent Literature 2 (Japanese Patent Application Laid-Open Publication No. 2012-252639) aims at providing a building for accommodating electronic devices therein, which efficiently radiates inside heat to the outside while protecting the electronic devices by improving sealing performance, and which can be expanded and moved easily. Metal fasteners capable of being engaged with a tightener are fixed at upper and lower portions of columnar members disposed at four corners of a building, the building having a roof at a position lower than the metal fasteners and an intermediate ceiling board below the roof. Racks accommodating electronic devices are stored in a lower chamber under the intermediate ceiling board, wherein a heat exchanger and an air circulation fan for cooling air are disposed in the lower chamber, and an outdoor heat exchanger for radiating heat is disposed above the lower chamber, so that they sandwich the intermediate ceiling board. When the number of electronic devices increases, the building can be increased by directly disposing one building on another and engaging the metal fasteners with the tighteners. Heat generated by the electronic devices is radiated to the outside air through the heat exchanger in the lower chamber and the outside heat exchanger. The interior of the building is divided into a computer room CR storing computers such as servers and storages in the interior of the room, and a machine room MR having installed therein a power supply unit EU for supplying power to the computers and the like and a spare air conditioning outdoor unit CD and the like.

CITATION LIST

Patent Literature

[PTL 1] Japanese Patent Application Laid-Open Publication No. 2012-98799
[PTL 2] Japanese Patent Application Laid-Open Publication No. 2012-252639

Non-Patent Literature

[NPL 1] https://www.hitachi-systems.com/solution/s006/fmitsm/cdc.html

SUMMARY OF INVENTION

Technical Problem

However, the configuration of Patent Literature 2 requires the interior of the container to be divided into two sections, and to further dispose a server rack to the boundary of the two sections, so that in order to realize the configuration by modifying existing containers, such as a generally distributed dry container in compliance with ISO standards or containers for office use, an extremely high remodeling cost is required.

Therefore, the present invention aims at providing an air conditioning facility for a container-type data center capable of being applied to an existing container to easily divide the interior of the container into a cooling area and a heat exhaust area, and enhancing the cooling effect of the IT equipment stored in the racks.

Solution to Problem

The present invention provides a container-type data center having an air conditioning facility, in compliance with standards of a container for transportation, having disposed therein multiple racks for accommodating multiple IT equipment, and having an indoor unit and an outdoor unit as air conditioning facilities for cooling the IT equipment; the container-type data center separated by a partition panel into an indoor area in which the IT equipment and the indoor unit of the air conditioning facility are arranged, and an outer area in which the outdoor unit of the air conditioning facility is arranged; the indoor unit disposed within the indoor area where the IT equipment is arranged has a vent for sending out cooling air toward an upper direction at a top portion thereof, and an air intake opening for taking in warm air from a lower portion; aligning multiple racks having IT equipment installed thereto within the indoor area to form a cooling area on one side and a heat exhaust area on the other side with the multiple racks set as the boundary; and a system ceiling arranged to correspond to the height of the vent on the upper portion of the indoor unit disposed within the indoor area, so as to conduct the cool air flowing out from the vent on the upper area of the indoor unit disposed within the indoor area toward the cooling area.

According further to the container-type data center having an air conditioning facility, the system ceiling is designed to have a trapezoidal cross-sectional shape, the width-direction dimension thereof on the side of the indoor unit being formed wider than a width-direction dimension of the vent, the width of the cooling area side being set to a width dimension corresponding to a distance from a center area of the container to a side wall of the container, and having a down-wall disposed on an oblique side thereof.

According further to the container-type data center having an air conditioning facility, a cooling air flow-out prevention member is formed at a clearance between the top portion of the rack and the ceiling surface of the container so that the cooling air is prevented from flowing out from the cooling area to the heat exhaust area without passing through an inner portion of the rack installing the IT equipment.

According even further to the container-type data center having an air conditioning facility, a cooling air flow-out prevention member in a form of a shop curtain is disposed at a path for personnel entering the cooling area, so that the cooling air is prevented from flowing out from the cooling area to the heat exhaust area without passing through an inner portion of the rack loading the IT equipment.

Advantageous Effects of Invention

According to the present invention, the interior of the container is divided into a cooling area and a heat exhaust area via a rack, and cooling air will not flow out to the heat exhaust area without passing through the rack by a draft air duct formed by a system ceiling, a down wall and a container ceiling surface, so that the cooling air is provided with a function of a duct, and cooling air can be sent out to the rack accommodating IT equipments securely without providing a duct thereto, and the configuration for improving the cooling efficiency of the container can be realized at a low cost.

DESCRIPTION OF EMBODIMENTS

Figure 1:
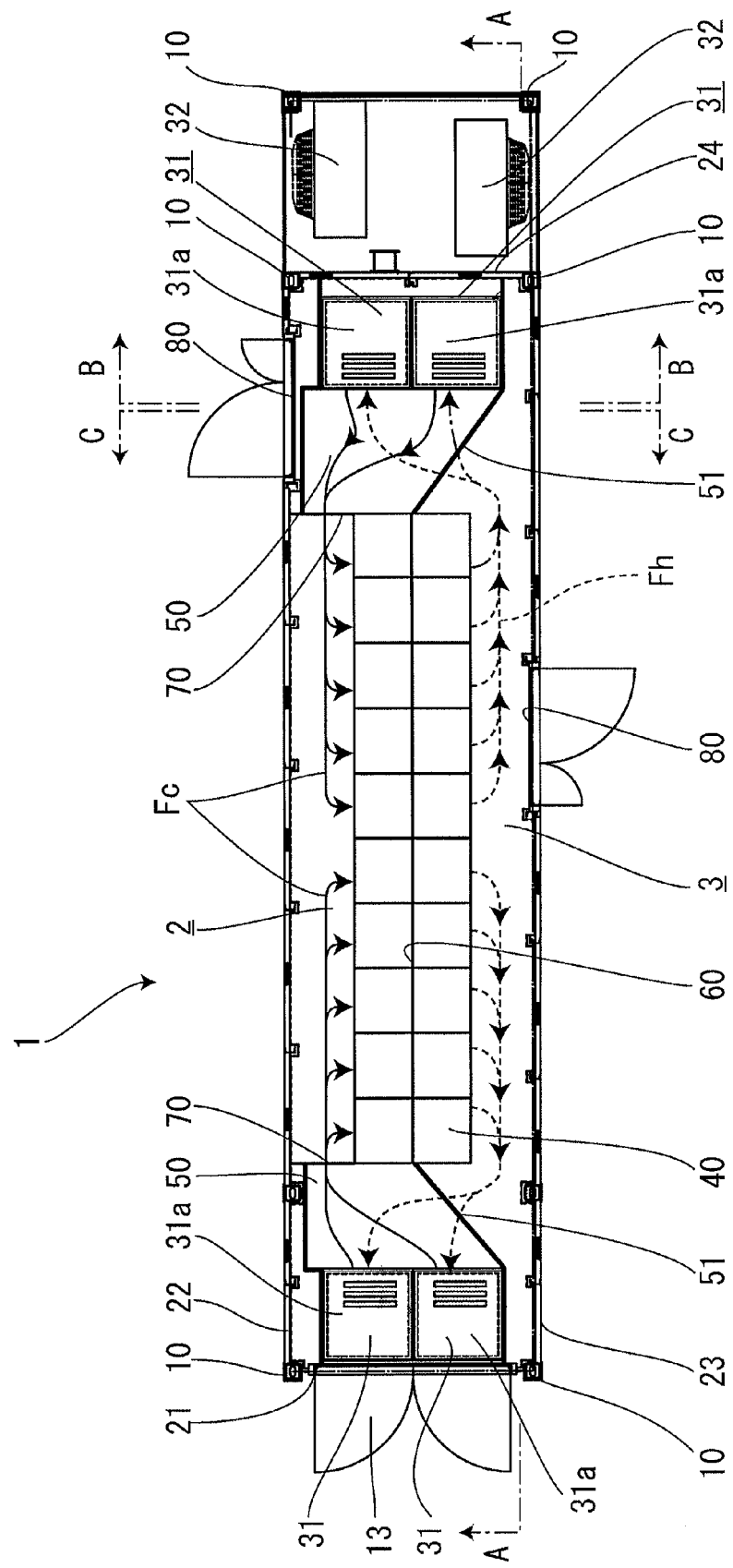
FIG. 1 is a plan view illustrating the relationship of arrangement of various devices within a container of a container-type data center having an air conditioning facility according to the present invention.

Now, the preferred embodiments for implementing the present invention will be described with reference to the drawings. Obviously, the present invention is easily applicable to configurations other than those illustrated in the present embodiment within the scope of the present invention. In the present specification, the longitudinal direction of a container is referred to as a "length direction", and a direction perpendicular thereto is referred to as a "width direction". Further, as for the terms "inner side" and "outside", the direction toward the inside of the container is referred to as "inside", and the direction toward the outer side thereof is referred to as "outside" or "outer side".

The present applicant has developed a container-type data center, as disclosed in Non-Patent Literature 1. The disclosed data center has IT equipment such as a server and power supply/air conditioning facilities stored in a container, according to which the facilities required for a data center are gathered to provide a one-stop introduction and operation management. The size of its exterior is designed to facilitate transportation, so that transportation to various locations is enabled. The interior of the container adopts a layout to ensure sufficient maintenance space.

The container-type data center developed by the present applicant enables to realize automated operation by implementing a remote operation monitoring service. Further, the data center is designed to enable statuses of air-conditioning, power and power source to be confirmed, and to enable visual confirmation of the servers disposed within the container from a remote location using a monitoring camera. Therefore, it becomes possible to detect the occurrence of failure at an early stage, and to take measures for the failure. Further, the center is designed to detect abnormalities such as unauthorized invasion to the container, for example, through an outer monitoring operation using a monitoring camera, guarding of the circumference using laser, or entrance and exit control using biometric authentication.

Reference number 1 is a container having a structure according to ISO standards. The container size and upper and lower connecting interfaces are designed in compliance with ISO container standards (ISO Standards 6346). The container 1 is formed by preparing two sets of frames formed in a substantially rectangular shape using H steels made of iron, each of which is formed as an upper side frame and a lower side frame, the four corners of which are connected via pillar sections 10 formed of H steels made of iron, thereby forming the framework having an overall substantially rectangular parallelepiped shape. A plate made of iron is mounted on the upper side frame to constitute a ceiling surface 25, and a plate made of iron is similarly mounted on the lower side frame to constitute a floor surface 26.

By forming the framework using H steels as described, it becomes possible to provide sufficient strength for stacking multiple containers 1 and to prevent deformation by vibration and the like. Further, common twist-lock mechanisms not illustrated are formed at the four corners of the upper side frame and the lower side frame of the container 1, which have both the function of a positioning guide for stacking multiple containers 1 and the function for preventing displacement of the stacked containers.

The container-type data center of the present invention is a sealed steel container, and doors are made airtight. Internal heating generated from the IT equipment is cooled by an air conditioning unit disposed in the interior thereof, which adopts an air circulation system. Thus, unattended operation is enabled, and high waterproof and dustproof performances can be ensured during operation. However, there is a need to consider ventilation for manual operation within the container.

The external shape of the container can be designed freely according to the number of racks for installing the IT equipment, and the illustrated embodiment is designed equal to a 40-ft container size, with an interface unit for securing the container for transportation on ships and trailers. Thus, there are advantages in that securing is facilitated for transporting the container on ships, and that the container can be transported on a standard trailer for trailer transportation. However, shipment of the container on a ship is a product delivery of a completed product, so that there is a need to consider transportation that will not damage the main body of the container.

According to the container-type data center of the present invention, a vibration isolation table unit having a vibration isolating mechanism is disposed on a bottom portion of the container so as to enable transportation on a trailer with the IT equipment loaded therein. This mechanism enables to significantly reduce the acceleration of vibration in the vertical direction during transportation.

The container-type data center according to the present invention can be designed to enable outdoor units for the air conditioner of the container to be disposed on the same floor as the container on the outer side of the container having the IT equipment arranged therein, for facilitating movement. Thereby, the refrigerant piping can be fixed, and there is no need to reinstall the outdoor units and lay the refrigerant piping every time the container is moved. Four air-cooled units are installed as the air conditioning facility, one of which is a spare.

Two indoor units 31, which constitute a part of the air conditioning facility, are disposed at each longitudinal end within the indoor area of the container 1. The indoor unit 31 takes in the air of the chamber through a lower air intake opening 31b (FIG. 2), performs heat exchange within the outdoor units 32 to cool the intake air, and sends out the cooled air through vents 31a disposed above the indoor units 31.

The container 1 is divided by a partition panel 24 into an IT equipment accommodation chamber for accommodating racks 40 storing IT equipment (not shown) and an outdoor unit facility chamber for the air conditioning facility. Pillar sections 10 for partition formed of H steels similar to pillar sections 10 are disposed on the width-direction ends of the partition panel 24. An iron door 13 is disposed on a wall surface opposing to the outdoor unit facility chamber of the container 1. Thereby, the area of the IT equipment accommodation chamber of the container 1 is surrounded by the upper side frame, the lower side frame, pillar sections and partition pillar sections, and an enclosed space is formed with the iron plates attached to the ceiling surface, the floor surface and side walls, and the partition panel 24 and the iron door 13 disposed on the end walls. According to the container-type data center of the present invention, the IT equipment accommodation chamber forms an air-conditioned and enclosed space during operation, but during maintenance and the like, operators must enter and exit the IT equipment accommodation chamber, so that an entrance/exit door 80 is formed arbitrarily on the side wall. The iron door 13 on the wall surface opposed to the outdoor unit facility chamber of the container 1 functions as an entrance opening for carrying in indoor units 31 of the air conditioning facility, racks 40 and IT equipment to be stored in the racks to the container, and when carrying in of the components is completed, the entrance is closed.

Figure 2:
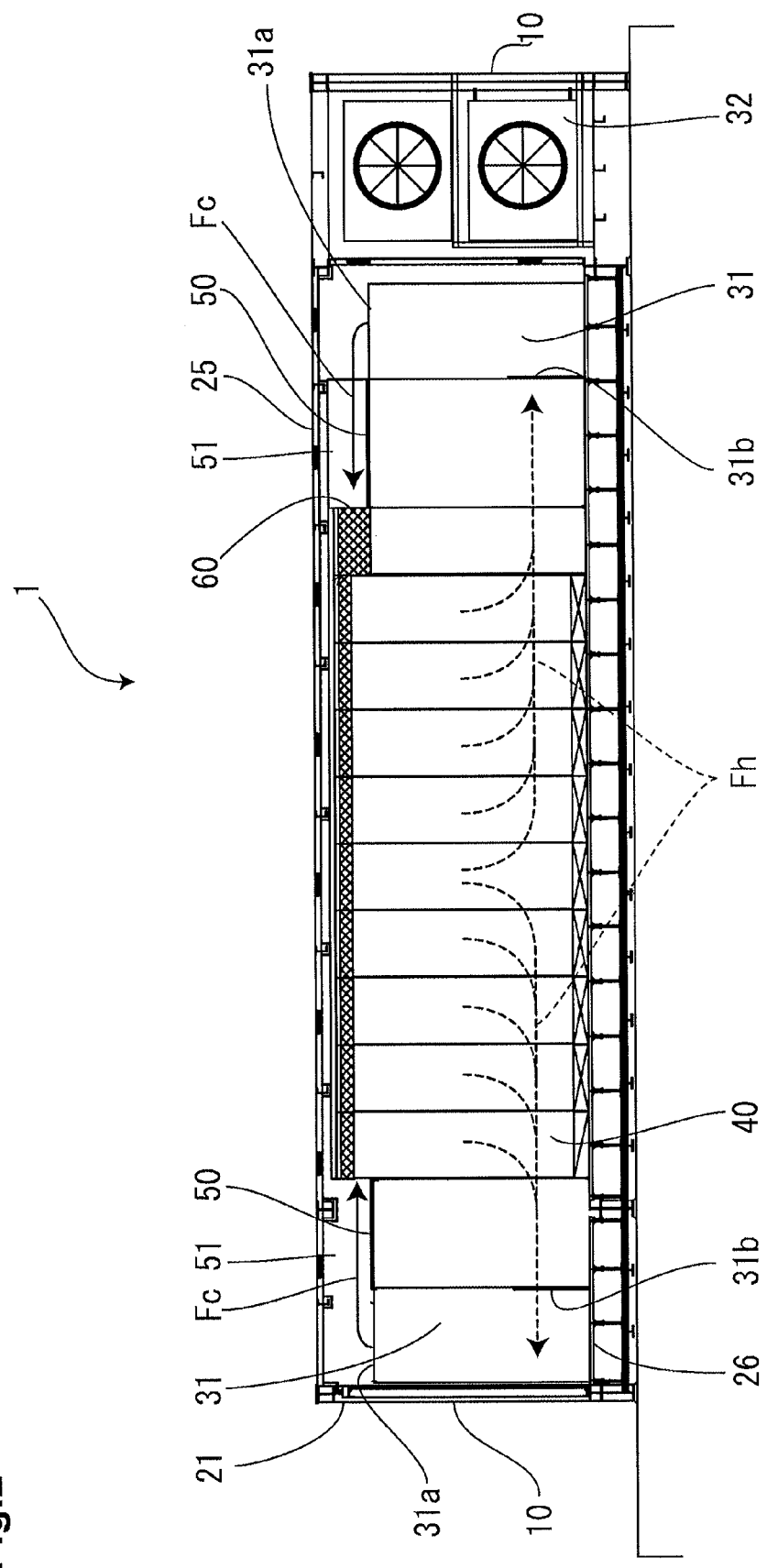
FIG. 2 is a cross-sectional view of a container-type data center taken along line A-A of FIG. 1.
Figure 3:
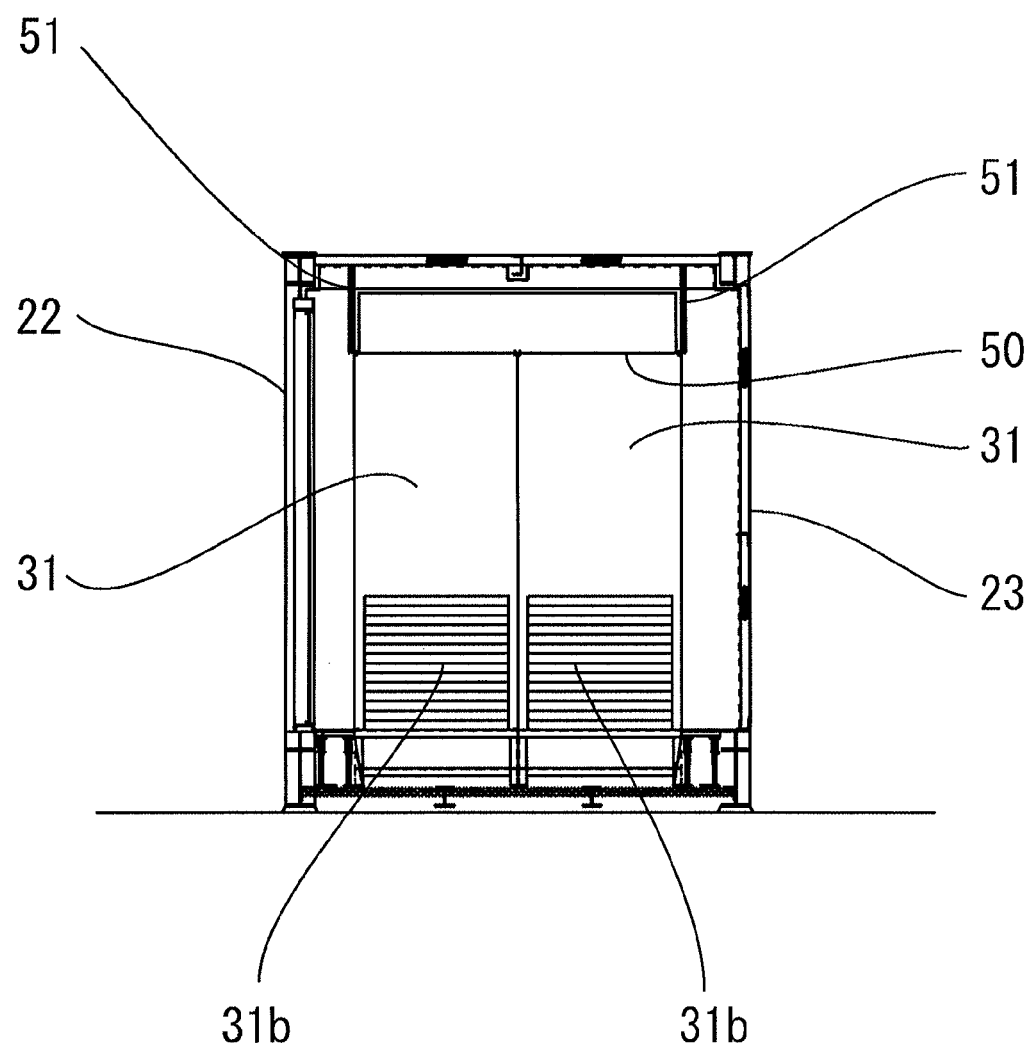
FIG. 3 is a cross-sectional view of a container-type data center taken along line B-B of FIG. 1.
Figure 4:
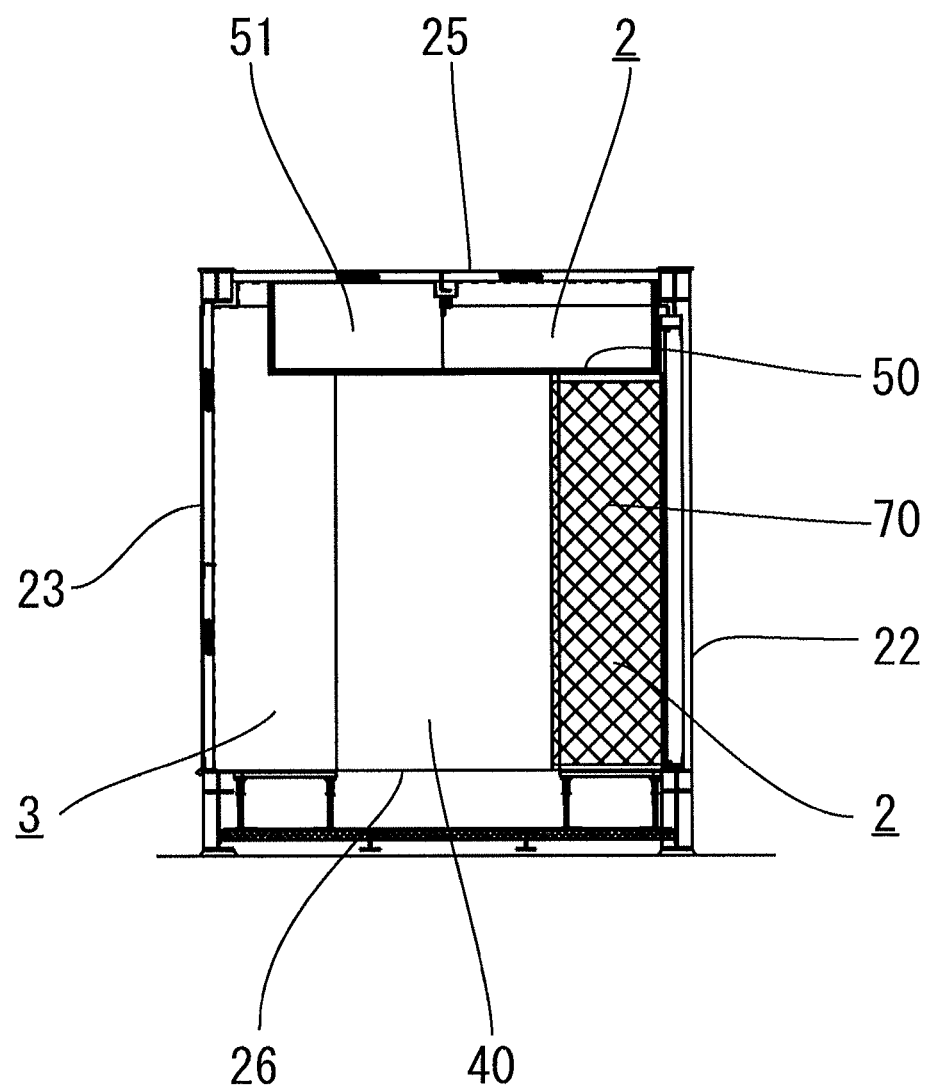
FIG. 4 is a cross-sectional view of a container-type data center taken along line C-C of FIG. 1.

In the interior of the container 1 are arranged a given number of racks 40 for accommodating IT equipment at the longitudinal center area of the container 1. The racks 40 should preferably be in the form of steel racks or the like composed of multiple rows of net racks with much clearance, so as to enhance the cooling efficiency of IT equipment not shown installed on the racks 40. The container 1 is divided into a cooling area 2 in which cooling air cooled by the air conditioning facility is discharged, and a heat exhaust area 3 where the cooling air, which has passed the racks 40 and cooled the IT equipment, and which contains the exhaust heat therefrom, flows, wherein the row of the racks 40 installing the IT equipments is set as the boundary. A vinyl curtain 60 is attached along the longitudinal direction to the clearance formed between the top portion of the racks 40 and a ceiling surface 25 of the container 1 (FIG. 2). Thereby, convection of air between the cooling area 2 and the heat exhaust area 3 at the upper portion of the rack 40 can be prevented.

It is necessary to send the cooling air sent out from the indoor unit 31 without fail to the cooling area 2 in the interior of the container 1. In order to do so, generally an arrangement is adopted including a duct and having the air discharge opening of the duct positioned near the racks so that the cooling air is discharged toward the IT equipment accommodated in the racks 40, but if ducts are arranged toward the racks 40, a drawback occurs where the maintenance operation space becomes narrow.

Figure 5:
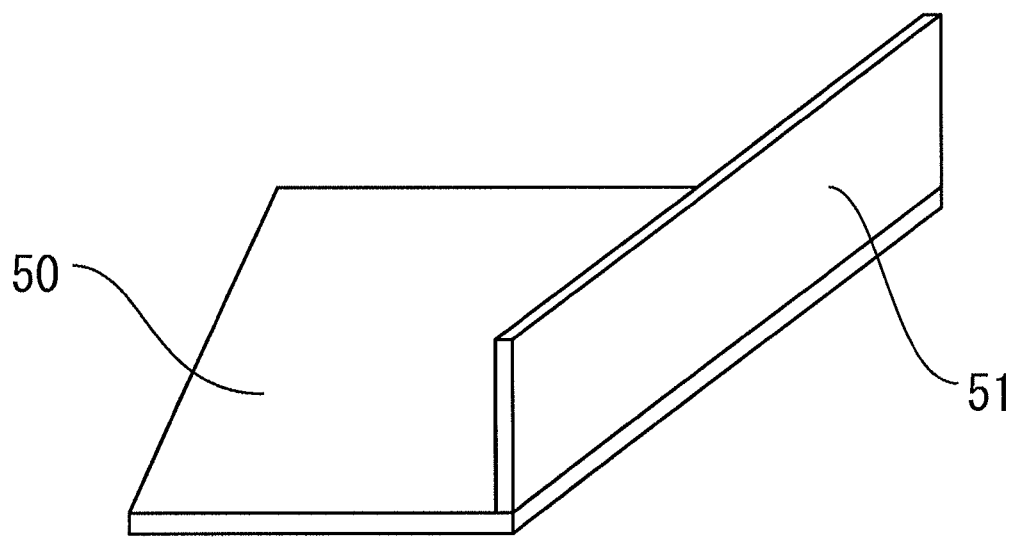
FIG. 5 is a detailed view of a system ceiling used in the container-type data center having air conditioning facility according to the present invention.
Figure 6:
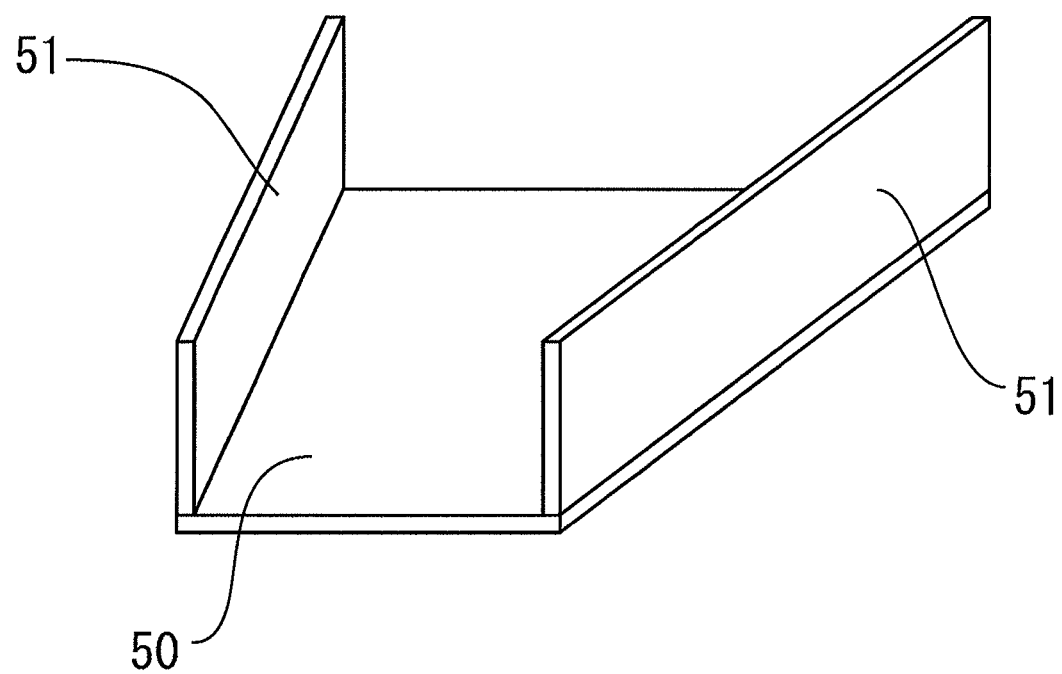
FIG. 6 is a detailed view illustrating another example of a system ceiling used in the container-type data center having air conditioning facility according to the present invention.

Therefore, according to the preferred embodiment of the container-type data center having an air conditioning facility of the present invention, a system ceiling 50 is used instead of a duct to infallibly send the created cooling air from the vent 31a on the upper side of the indoor unit 31 to the cooling area 2. The system ceiling 50 is formed of a plate-like member, which is hung from the ceiling surfaced 25 of the container 1 via a hanger or the like not shown. The position of the system ceiling 50 is set to substantially the same height as the vent 31a of the cooling air of the indoor unit 31. The system ceiling 50 has a trapezoidal planar shape, and preferably, the width-direction dimension thereof on the side of the indoor unit 31 is required to be formed at least wider than the width direction size of the vent 31a, and the width of the other end toward the cooling area 2 should be a width dimension corresponding to the distance from the position of the vinyl curtain 60 disposed in the longitudinal direction at the upper area of the rack 40 to the side wall 22 of the container 1. Thereby, it can introduce the cooling air from the vent 31a without fail at the side of the indoor unit 31 having a wide width, and the air is sent out toward the cooling area 2. As shown in detail in FIG. 5, a down-wall 51 is provided between the system ceiling 50 and the ceiling surface 25 of the container 1, and thereby, the cooling air from the vent 31a at the upper portion of the indoor unit 31 is prevented from flowing toward the heat exhaust area 3, and instead, a cylindrical draft air duct is formed using the system ceiling 50 from the vent 31a at the upper portion of the indoor unit 31 toward the cooling area 2, so that the cooling area 2 itself will have a function equivalent to a duct. This arrangement enables to prevent the leakage of the cooling air sent out from the vent 31a of the indoor unit 31 to the heat exhaust area 3 without passing through the IT equipment mounted on the racks 40, and enables to send out the cooling air to the cooling area 2, that is, to the IT equipment stored in the racks 40. Further, by designing the system ceiling 50 as shown in FIG. 6 so that the down-walls 51 are arranged to realize a substantially U-shaped cross-section, there will be no space formed between the horizontal section of the system ceiling 50 and the inner side of the side wall 22 of the container, and the cooling air can be sent out without fail to the cooling area 2.

It is possible to provide the function of a duct to the cooling area 2 by the above-described system ceiling 50, but when a space through which operators can move through the heat exhaust area 3 and the cooling area 2 is provided below the system ceiling 50, that space will also allow air to move between the cooling area 2 and the heat exhaust area 3. An air intake opening 31b of the indoor unit 31 is provided below the system ceiling 50, and when warm air is taken in through the opening, there is fear that the cooling air may also flow through this space toward the intake opening 31b of the indoor unit 31. In order to prevent cooling air from leaking into this space, a vinyl curtain 70 substantially of a same dimension as the height from the floor surface 26 of the container 1 to the system ceiling 50 is attached to the end on the side of the cooling area 2 of the system ceiling 50, by which the space is closed. At this time, by forming the lower end and left and right ends of the vinyl curtain 70 as free ends, the curtain can adopt a short shop-curtain-like form, so that it will not interfere with the movement of operators while preventing convection of air.

According to the container-type data center having an air conditioning formed as above, the cooling air sent out from the vent 31a of the indoor unit 31 can be introduced through a path shown by arrow Fc (shown by solid line) with the cooling area 2 functioning as the duct, so that the cooling air can be flown toward the IT equipments installed on the racks without fail, and further, the air containing exhaust heat can be introduced along the path shown by arrow Fh (shown by dotted line) to the intake opening 31b of the indoor unit 31. Furthermore, this configuration enables to prevent air containing exhaust heat from flowing into the cooling area 2, so that the enhancement of cooling efficiency can be realized.

The preferred embodiments of the present invention have been described, but the present invention is not restricted to the above embodiments, and various modifications are possible within the scope of the present invention. For example, a vinyl curtain has been hung on the upper portion of the rack 40, but the present invention is not restricted to such configuration, and any configuration can be adopted as long as the flowing of air from the heat exhaust area 3 to the cooling area 2 at the upper portion of the rack 40 is prevented, so that the clearance on the upper portion of the rack 40 can be closed by a plate-like member, for example.

REFERENCE SIGNS LIST

1 Container
2 Cooling area
3 Heat exhaust area
10 Pillar section
21 Iron door
22, 23 Side wall
24 Partition panel
25 Ceiling surface
26 Floor surface
31 Indoor unit
31a Vent
31b Air intake opening
32 Outdoor unit
40 Rack
50 System ceiling
51 Down wall
60 Vinyl curtain (Cooling air flow-in preventing member)
70 Vinyl curtain (Shop curtain-like cooling air flow-in preventing member)
Fc Cooling air passage
Fh Heated air passage

The invention claimed is:

1. A container-type data center having an air conditioning facility, in compliance with standards of a container for transportation, having disposed therein multiple racks for accommodating multiple IT equipment, and having an indoor unit and an outdoor unit as air conditioning facilities for cooling the IT equipment;
the container-type data center separated by a partition panel into an indoor area in which the IT equipment and the indoor unit of the air conditioning facility are arranged, and an outdoor area in which the outdoor unit of the air conditioning facility is arranged;
the indoor unit disposed within the indoor area where the IT equipment is arranged has a vent for sending out cooling air toward an upper direction at a top portion thereof, and an air intake opening for taking in warm air from a lower portion;
aligning multiple racks having IT equipment mounted thereto within the indoor area to form a cooling area on one side and a heat exhaust area on the other side with the multiple racks set as the boundary;
a system ceiling arranged to correspond to the height of the vent on the upper portion of the indoor unit disposed within the indoor area, so as to conduct the cool air flowing out from the vent on the upper area of the indoor unit disposed within the indoor area toward the cooling area; and
the system ceiling is designed to have a trapezoidal cross-sectional shape, the width-direction dimension thereof on the side of the indoor unit being formed wider than a width-direction dimension of the vent, the width of the cooling area side being set to a width dimension corresponding to a distance from a center area of the container to a side wall of the container, and having a down-wall disposed on an oblique side thereof.

2. The container-type data center having an air conditioning facility according to claim 1, wherein
a cooling air flow-out prevention member is formed at a clearance between the top portion of the rack and the ceiling surface of the container so that the cooling air is prevented from flowing out from the cooling area to the heat exhaust area without passing through an inner portion of the rack loading the IT equipment.

3. The container-type data center having an air conditioning facility according to claim 1, wherein a cooling air flow-out prevention member in a form of a shop curtain is disposed at a path for operators entering the cooling area, so that the cooling air is prevented from flowing out from the cooling area to the heat exhaust area without passing through an inner portion of the rack loading the IT equipment.

* * * * *